United States Patent
Huang

(10) Patent No.: US 7,157,292 B2
(45) Date of Patent: Jan. 2, 2007

(54) LEADFRAME FOR A MULTI-CHIP PACKAGE AND METHOD FOR MANUFACTURING THE SAME

(75) Inventor: Yao-Ting Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/138,491

(22) Filed: May 27, 2005

(65) Prior Publication Data

US 2005/0287701 A1    Dec. 29, 2005

(30) Foreign Application Priority Data

Jun. 29, 2004  (TW) ............................... 93119105 A

(51) Int. Cl.
*H01L 21/66*    (2006.01)

(52) U.S. Cl. ....................................................... 438/15

(58) Field of Classification Search ................ 361/735, 361/736, 790, 749, 767; 438/15, 25, 26, 438/55, 64, 106, 107, 109, 110, 128; 257/686, 257/737, 738, 778

See application file for complete search history.

(56) References Cited

U.S. PATENT DOCUMENTS

| | | | | |
|---|---|---|---|---|
| 5,674,785 | A   * | 10/1997 | Akram et al. | 438/15 |
| 6,620,633 | B1 * | 9/2003 | Hembree et al. | 438/14 |
| 6,830,955 | B1 * | 12/2004 | Shin et al. | 438/106 |
| 6,933,524 | B1 * | 8/2005 | Hembree et al. | 257/48 |
| 2002/0192859 | A1 * | 12/2002 | Akram | 438/106 |
| 2004/0198022 | A1 * | 10/2004 | Alvarez | 438/460 |

* cited by examiner

*Primary Examiner*—Michael Lebentritt
*Assistant Examiner*—Andre' C. Stevenson
(74) *Attorney, Agent, or Firm*—Bacon & Thomas PLLC

(57) ABSTRACT

A leadframe for multi-chip package (MCP) including a die pad and a plurality of leads. A dielectric layer is formed on the lower surface of the die pad, so that the die pad is etched to form an interconnecting conductor with a bonding region. An insulation layer is formed on the interconnecting conductor and exposes the bonding region, so that a chip or a passive component can be electrically connected to the leads via the interconnecting conductor.

7 Claims, 5 Drawing Sheets

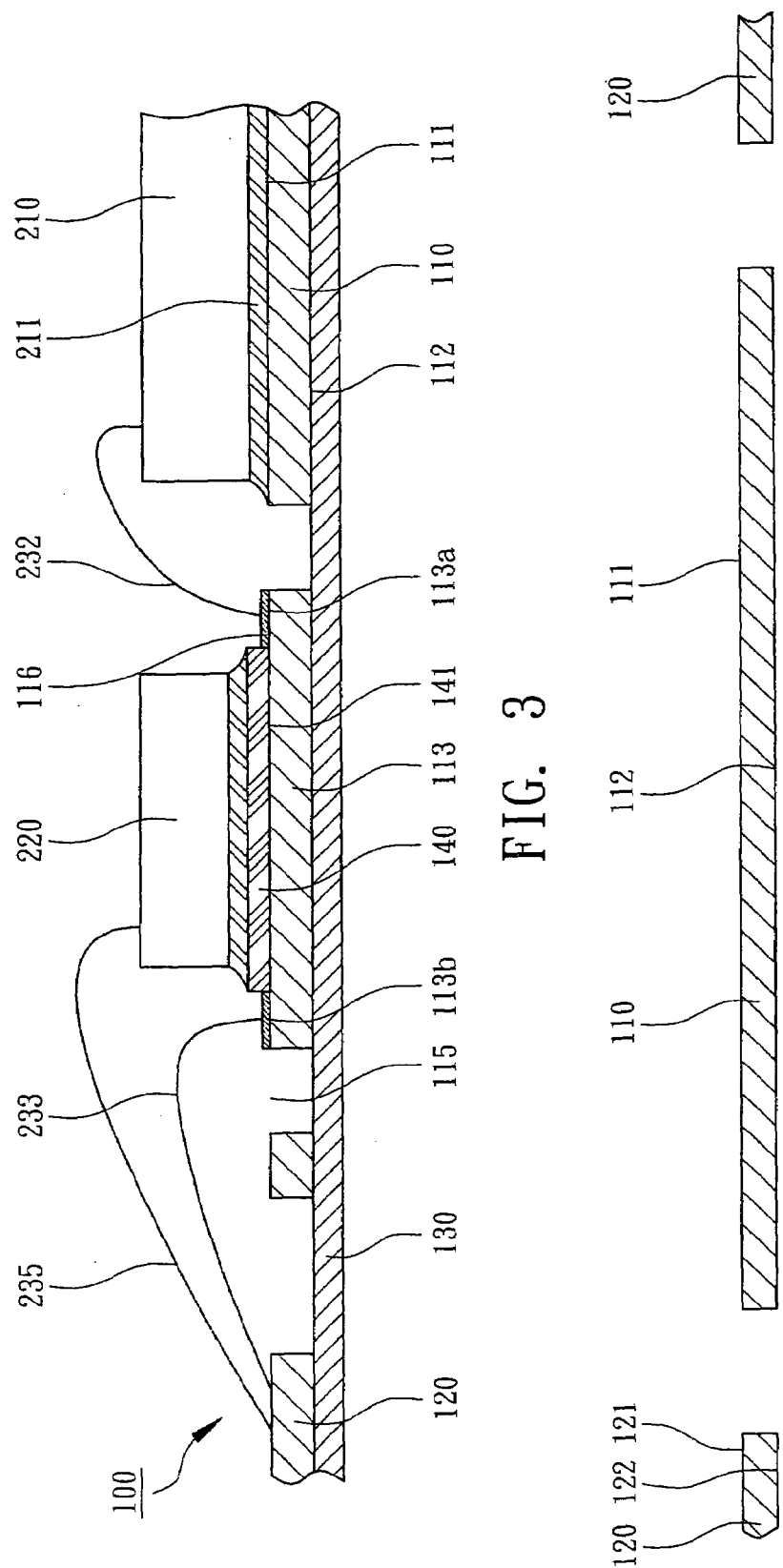

LEADFRAME FOR A MULTI-CHIP PACKAGE AND METHOD FOR MANUFACTURING THE SAME

This application claims the benefit of Taiwan application Serial No. 93119105, filed Jun. 29, 2004, the subject matter of which is incorporated herein by reference.

BACKGROUND OF THE INVENTION

1. Field of the Invention

The invention relates in general to a leadframe, and more particularly to a leadframe for a multi-chip package and a manufacturing method for the same.

2. Description of the Related Art

Multi-chip package (MCP), a packaging technology attracting more and more attentions recently, integrates several chips of various types or passive pieces into a semiconductor package structure, so that the MCP achieves the features of more versatile functions or higher capacity. As the conductive path of the chips inside the package becomes more complicated, the commonly used chip carrier of multi-chip package is a multi-layer circuit substrate. In order to reduce the packaging cost, a low-cost leadframe is used to replace the multi-layer circuit substrate in a multi-chip package.

A leadframe for multi-chip package is disclosed in "Multi-chip IC Package", Taiwanese Patent Publication No. 428875. The leadframe includes a die pad and a plurality of leads. A plurality of chips are attached on the die pad. A TAB tape is used to connect the soldering pad of the chips to the leads to overcome the difficulty encountered in cross-wire connection of the bonding wires. Currently, all of electrical connecting machines which use leadframe are wire-bonding machines, and applying TAB technology to leadframe involves the change in packaging equipment and bonding wires. Moreover, it is expensive and not practical to dispose a TAB tape on the current die pad or dispose an extra substrate.

Referring to FIG. 1, a most commonly used leadframe for multi-chip package is shown. A plurality of chips 30, 40, and 50 are disposed on a die pad 10 of a leadframe. A plurality of bonding wires 61, 62, 63, and 64 are used to electrically connect the chips 30, 40, and 50 to the corresponding lead 20 of the leadframe. The bonding wires 61 connect the chip 30 to the lead 20 positioned closer by. The bonding wires 62 connect the chip 40 to the lead 20 positioned closer by. The bonding wires 63 connect the chip 50 to the lead 20 positioned closer by. If the bonding wire is directly used to electrically connect the chip 50 to the lead 20 positioned farther away, the bonding wire has to cross over the chip 30 or 40. The bonding wire being too long is likely to be warded off during mold-pressing. Therefore part of the bonding wire 64 has to connect the chip 50 to the chip 30. A transferring circuit needs to be disposed on the active surface of the chip 30, and then connected to the chip 50 positioned farther away lead by other bonding wires 61. Therefore, the chip must have special design of circuits or dummy bonding pads, and cannot integrate multiple semi-conductor chips with ordinary circuit design into a die pad of a leadframe.

SUMMARY OF THE INVENTION

A main object of the invention is to provide a leadframe for multi-chip package including a die pad and a plurality of leads. At least an interconnecting conductor is formed on the die pad. A dielectric layer is formed on the lower surface of the die pad to be insulatedly attached to the interconnecting conductor. An insulation layer is formed on the interconnecting conductor and exposes at least a bonding region, so that a chip disposed on the die pad or a passive component disposed on the interconnecting conductor can be electrically connected to the leads via the interconnecting conductor.

A second object of the invention is to provide a leadframe for multi-chip package. At least an interconnecting conductor with a bonding region is formed on a die pad. An insulation layer having a barrier surface is formed between the bonding regions of the interconnecting conductor. The insulation layer facilitates the adherence of a chip and prevents the soldering flux disposed on one of the bonding regions of a passive component from spreading over to other bonding regions; not only increasing the wiring layout inside the leadframe, but also reducing components on the multi-layer circuit board of the multi-chip package.

The leadframe for multi-chip package according to the invention mainly includes a die pad, a plurality of leads, a dielectric layer and an insulation layer. The die pad has an upper surface and a lower surface, and at least an interconnecting conductor is formed on the die pad. The interconnecting conductor has at least a bonding region. The dielectric layer is formed on the lower surface of the die pad to be insulatedly attached to the interconnecting conductor. The insulation-layer is formed on the interconnecting conductor and exposes the bonding region. Preferably, the insulation layer has a barrier surface formed between the bonding regions of the interconnecting conductor. The leads are disposed on the periphery of the die pad Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 3 is a cross-sectional view of the leadframe for multi-chip package after chip-bonding and wire-bonding according to a first embodiment of the invention;

FIGS. 4A to 4G are cross-sectional views of the leadframe for multi-chip package during the manufacturing process according to a first embodiment of the invention;

DETAILED DESCRIPTION OF THE INVENTION

First Embodiment

Figure 2:
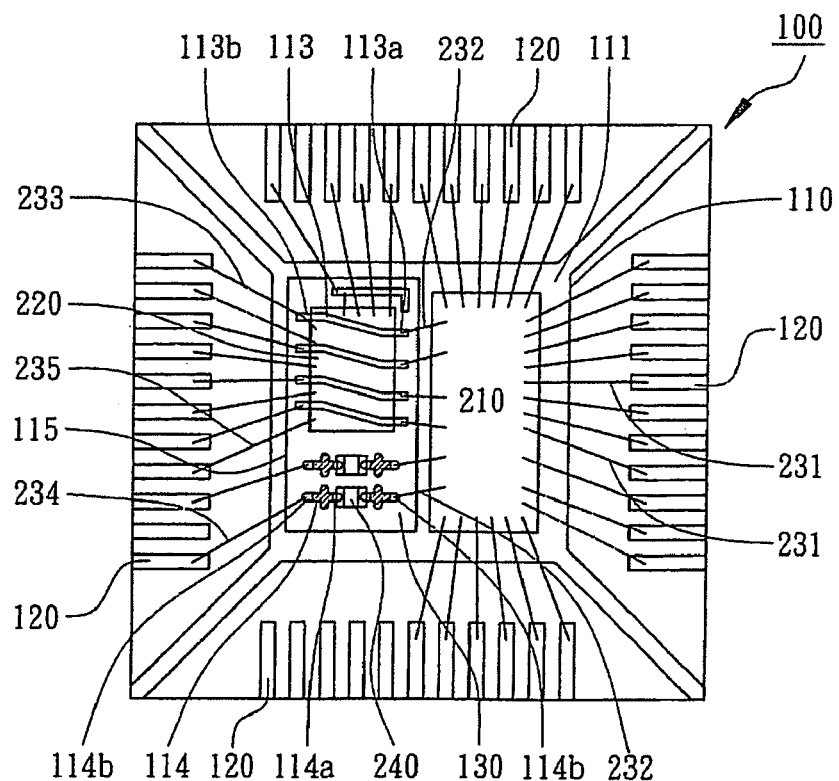
FIG. 2 is a diagram of the upper surface of a leadframe for multi-chip package after chip-bonding and wire-bonding according to a first embodiment of the invention.
Figure 4B:
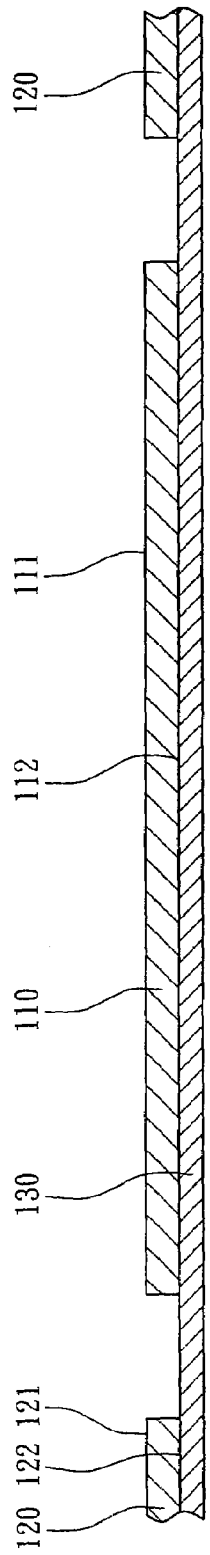
Figure 4C:
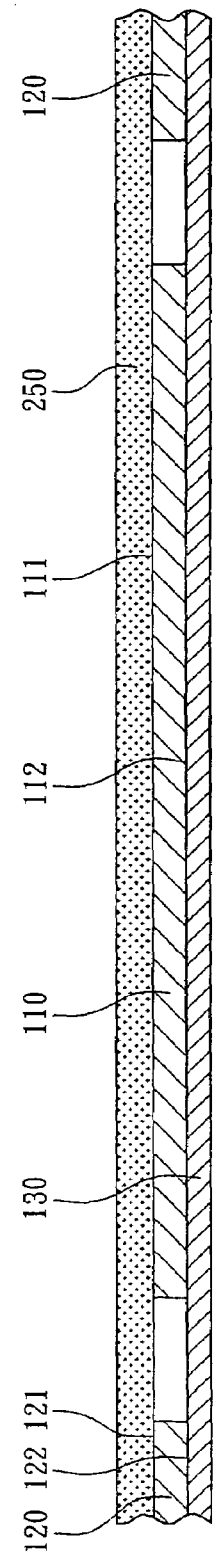
Figure 4D:
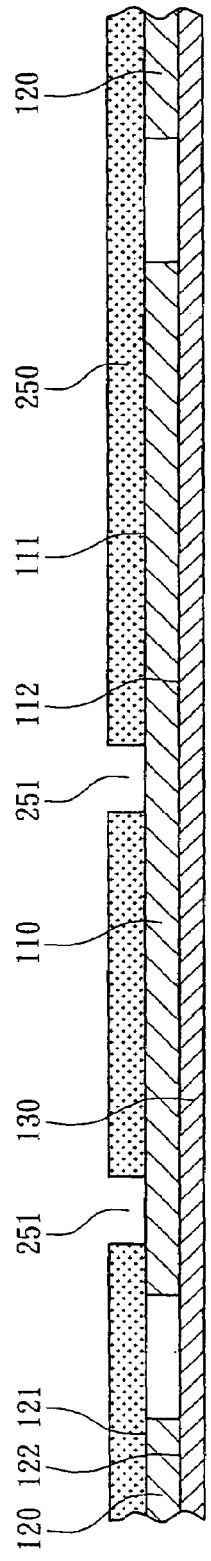
Figure 4E:
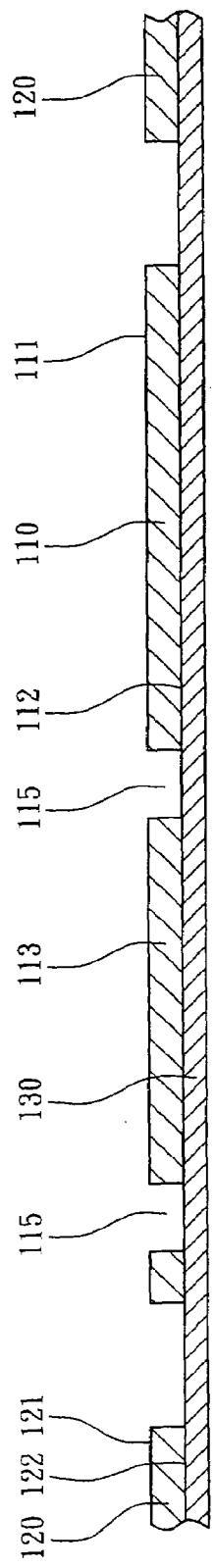
Figure 4F:
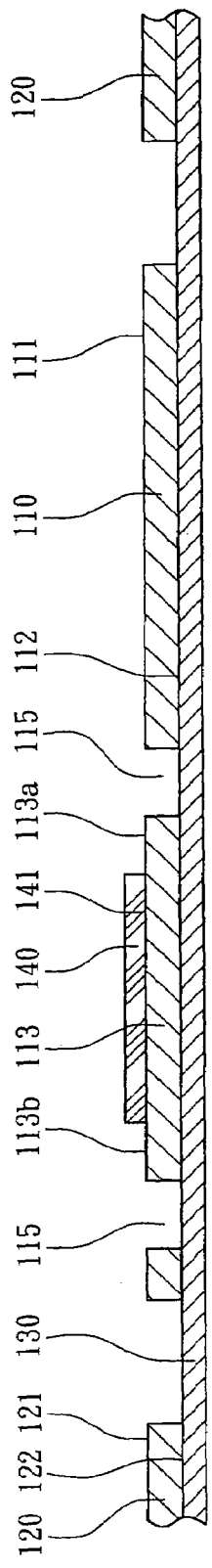
Figure 4G:
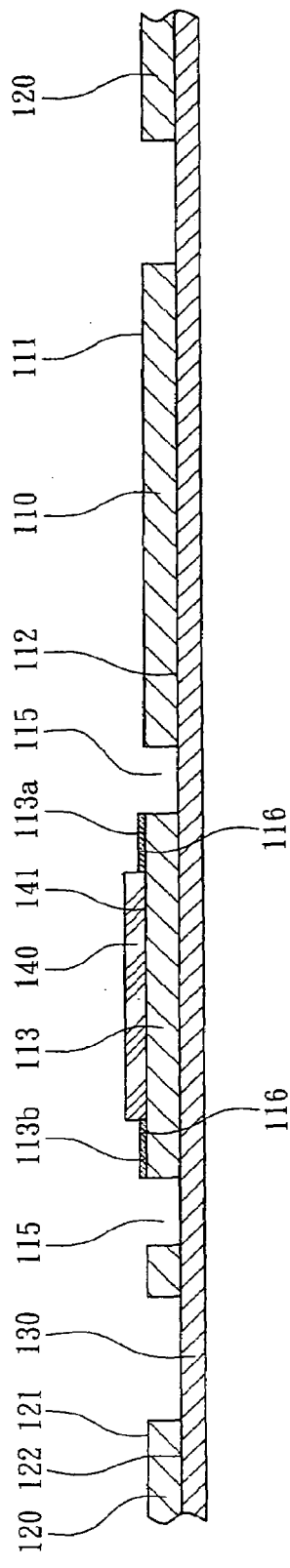

Referring to FIG. 2 and FIG. 3, a leadframe for multi-chip package 100 mainly includes a die pad 110, a plurality of leads 120, a dielectric layer 130 and an insulation layer 140. The die pad 110 has an upper surface 111 and a lower surface 112. The leads 120 are disposed on the periphery of the die pad 110. At least a patterned conducting wire layer or a patterned interconnecting conductor, such as a first interconnecting conductor 113 and a second interconnecting conductor 114, are formed on the die pad 110 through etching technology. Preferably, the die pad 110 has an opening 115 inside which the first interconnecting conductor 113 and the second interconnecting conductor 114 are positioned.

The dielectric layer 130 is formed on the lower surface of 112 of the die pad 110 for being insulatedly attached to the die pad 110, the first interconnecting conductor 113 and the second interconnecting conductor 114. According to the present embodiment, the first interconnecting conductor 113 is formed in a bar fashion providing an electrical interconnection between a first chip 210 and a lead 120 positioned farther away as shown in FIG. 2 and FIG. 3, while the second interconnecting conductor 114 is formed in a island fashion for bonding a passive component 240. Preferably, the dielectric layer 130 is extended to be disposed on the lower surface of the leads 120, so that the structural strength of the leadframe is enhanced.

The insulation layer 140 formed on the first interconnecting conductor 113 and the second interconnecting conductor 114 can be a solder mask layer. According to the present embodiment, the insulation layer 140 further covers the dielectric layer 130 positioned between the first interconnecting conductor 113 and the second interconnecting conductor 114. The first interconnecting conductor 113 has a plurality of bonding regions 113a and 113b. The bonding region 113a of the first interconnecting conductor 113 is adjacent to the first chip 210, while the bonding region 113b is adjacent to the lead 120. Moreover, the second interconnecting conductor 114 has a plurality of bonding regions 114a and 114b. The bonding region 114a of the second interconnecting conductor 114 is for a soldering flux to be bonded onto the passive component 240, while another bonding region 114b of the second interconnecting conductor 114 is for a plurality of bonding wires 232 to be connected to the chip 210 or for a plurality of bonding wires 234 to be connected to corresponding leads 120. Preferably, a nickel-gold layer 116 can be formed on the bonding region 113a of the first interconnecting conductor 113 and 113b and the bonding region 114a of the second interconnecting conductor 114 and 114b. The insulation layer 140 exposes the bonding region 113a of the first interconnecting conductor 113 and 113b and the bonding region 114a of the second interconnecting conductor 114 and 114b. Preferably, the insulation layer 140 has a barrier surface 141 formed between the bonding regions 113a and 113b of the first interconnecting conductor 113 and between the bonding regions 114a and 114b of the second interconnecting conductor 114, so that a second chip 220 can be attached onto the insulation layer 140 of the first interconnecting conductor 113. Thus, the soldering flux bonding the passive component 240 onto the bonding region 114a of the second interconnecting conductor 114 is isolated and prevented from spreading over to another bonding region 114b of the second interconnecting conductor 114.

Therefore, when the above leadframe 100 is used to manufacture a multi-chip package, a first chip 210 and a second chip 220 are fixed onto the upper surface 111 of the die pad 110 via an adhesive 211 for example. The second chip 220 corresponds to the opening 115 to be disposed on the insulation layer 140 on the first interconnecting conductor 113. The feature of electrical isolation of the insulation layer 140 prevents electrical short-circuit from occurring between the second chip 220 and the first interconnecting conductor 113. Alternatively, the second chip 220 can be directly disposed on the dielectric layer 130 (not shown in the diagram). A passive component 240 is bonded onto the bonding region 114b of the second interconnecting conductors 114 via a soldering flux. A plurality of bonding wires 231 connect the first chip 210 to the leads 120 positioned closer by. A plurality of bonding wires 235 connect the second chip 220 to the leads 120 positioned closer by. A plurality of bonding wires 232 connect the first chip 210 to the bonding region 113a of the first interconnecting conductor 113 to the bonding region 114b of the second interconnecting conductor 114, so that the first chip 210 is conducted to the first interconnecting conductor 113 and the passive component 240. Besides, a plurality of bonding wires 233 connect another bonding region 113b of the first interconnecting conductor 113 to the lead 120 positioned farther away, while a plurality of bonding wires 234 connect the bonding region 114b of the second interconnecting conductor 114 to the lead 120 positioned farther away. Therefore, the first chip 210 can be electrically conducted to corresponding lead 120 via the die pad 110. Lastly, a molding compound is used to seal the chips 210 and 220 and the passive component 240 (not shown in the diagram), so that a multi-chip package is formed, a passive component is added to further save power consumption, and that the internal multi-layer circuit substrate required in a multi-chip package according to prior art can be omitted.

Figure 1:
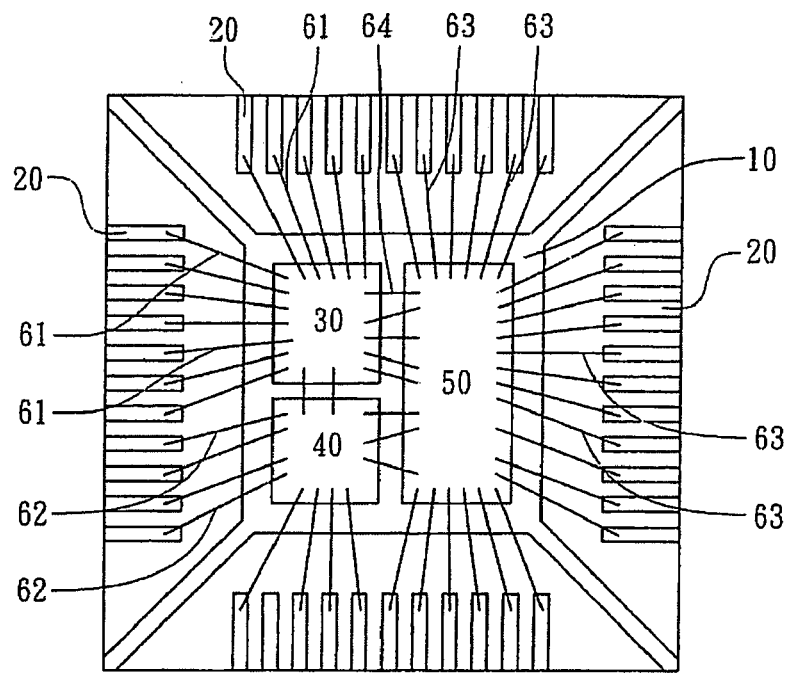
FIG. 1 (Prior Art) is a top view of a plurality of chips of a conventional multi-chip package when disposed on a leadframe.

The manufacturing method of the leadframe 100 is disclosed below. FIGS. 4A to 4G are cross-sectional views of the leadframe during the manufacturing process the leadframe. At first, referring to FIG. 4A, a leadframe 100 is provided. The leadframe 100 includes a die pad 110 and a plurality of leads 120. The die pad 110 has an upper surface 111 and a lower surface 112, while the leads 120 has an upper surface 121 and a lower surface 122. Next, referring to FIG. 4B, a dielectric layer 130 is disposed on the lower surface 112 of the die pad 110. Preferably, the dielectric layer 130 is also disposed on the lower surface 122 of the lead 120 at the same time. Next, referring to FIG. 4C, a dry film 250 is disposed on the upper surface 111 of the die pad 110 and the upper surface 121 of the leads 120. Next, referring to FIG. 4D, the dry film 250 is exposed to develop, so that an exposing region 251 is formed on the dry film 250. The exposing region 251 corresponds to the part of the opening 115 excluding the first interconnecting conductor 113 and the second interconnecting conductor 114 disclosed above. Next, referring to FIG. 4E, the die pad 110 is etched to form the first interconnecting conductor 113 and the second interconnecting conductor 114 as shown in FIG. 2 and FIG. 3, and the first interconnecting conductor 113 and the second interconnecting conductor 114 are insulatedly attached to the dielectric layer 130. Next, referring to FIG. 4F, the insulation layer 140 is formed on the first interconnecting conductor 113 and the second interconnecting conductor 114 via printing, exposing, developing, or pasting a film. The insulation layer 140 has a barrier surface 141 formed between the two bonding regions 113a and 113b of the first interconnecting conductor 113 with the bonding regions 113a and 113b being exposed. According to the present embodiment, the insulation layer 140 also covers the part between the two bonding region 114a and 114b of the second interconnecting conductor 114 as shown in FIG. 1. Lastly, referring to FIG. 4G, a nickel-gold layer 116 is electroplated on the bonding regions 113a and 113b, and the bonding regions 114a and 114b (not shown in the diagram), facilitating the bonding wires to be connected.

Second Embodiment

Figure 5:
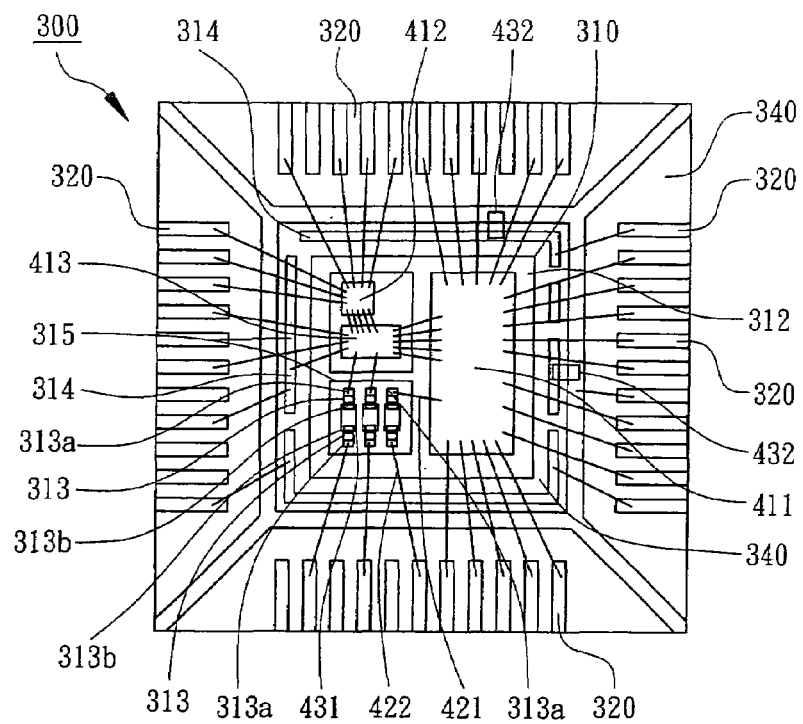
FIG. 5 is a diagram of the upper surface of a leadframe for multi-chip package after chip-bonding and wire-bonding according to a second embodiment of the invention.
Figure 6:
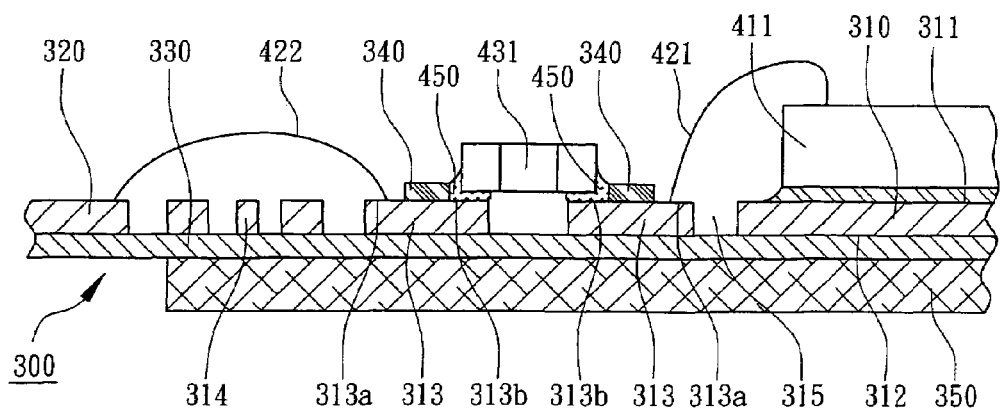
FIG. 6 is a cross-sectional view of the leadframe for multi-chip package after chip-bonding and wire-bonding according to a second embodiment of the invention.

Referring to FIGS. 5 and 6, a leadframe for multi-chip package 300 according to a second embodiment of the invention is shown. The leadframe for multi-chip package 300 mainly includes a die pad 310, a plurality of leads 320, a dielectric layer 330 and an insulation layer 340. The die pad 310 has an upper surface 311 and a lower surface 312. The leads 320 are disposed on the periphery of the die pad 310. A plurality of first interconnecting conductor 313 and at least a second interconnecting conductor 314 are formed on the die pad 310. The first interconnecting conductors 313 are disposed inside an opening 315 of the die pad 310. The second interconnecting conductor 314 is disposed on the periphery of the die pad 310 and can be bar-shaped, L-shaped or U-shaped. The first interconnecting conductors 313 has a plurality of bonding regions 313a and 313b for bonding a plurality of passive component 431 onto the bonding wires 421 and 422. The dielectric layer 330 is formed on the lower surface 312 of the die pad 310 to be insulatedly attached to the first interconnecting conductors 313 and the second interconnecting conductor 314. The insulation layer 340 is formed on the first interconnecting conductors 313 and the second interconnecting conductor 314. The insulation layer 340 has a barrier surface 341 formed between the bonding regions 313a and 313b of the first interconnecting conductors 313 and exposes the bonding regions 313a and 313b, so that the soldering flux bonding the passive component 431 is isolated and the short-circuit between bonding regions 313a and 313b of the same first interconnecting conductor 313 is prevented. Preferably, a metal plate 350 is disposed under the dielectric layer 330 to enhance dissipating the heat generated from multiple chips on the die pad 310.

Therefore, a plurality of chips 411, 412, 413 are disposed on the upper surface 311 of the die pad 310, while a plurality of bonding wires 421 and 422 electrically connect the chips 411, 412, and 413 to the leads 320. At least a bonding wire 421 connects the chip 411 to corresponding bonding region 313a of the first interconnecting conductor 313. The passive component 431 is bonded onto a bonding region 313b of the first interconnecting conductor 313 via the soldering flux 450. Being blocked by the insulation layer 340, the soldering flux 450 does not spread to another bonding region 313a of the first interconnecting conductors 313 as shown in FIG. 6. At least another bonding wire 422 connects a corresponding bonding region 313a of the first interconnecting conductor 313 to the leads 320. According to the present embodiment, another passive component 432 bonds the second interconnecting conductor 314 and the peripheral metal ring of the die pad 310 as shown in FIG. 5 as the power source or grounding interconnection. Therefore, the leadframe for multi-chip package 300 of the invention has a plurality of chips 411, 412, and 413 and the passive components 431 and 432 disposed on the upper surface 311 of the die pad 310, and uses the first interconnecting conductors 313 and the second interconnecting conductor 314 as the electrical interconnection between the chips and the leads to achieve die pad of a leadframe for multi-chip package without using a substrate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of leadframe for a multi-chip package, comprising:
    providing a leadframe, wherein the leadframe comprises a die pad and a plurality of leads, the die pad having an upper surface and a lower surface;
    forming a dielectric layer on the lower surface of the die pad;
    etching the die pad to form at least an interconnecting conductor spaced from the etched die pad, wherein both of the interconnecting conductor and the etched die pad are insulatedly attached to one side of the dielectric layer, the interconnecting conductor has a bonding region; and
    forming an insulation layer on the interconnecting conductor of the die pad, wherein the insulation layer exposes the bonding region of the interconnecting conductor.

2. The manufacturing method according to claim 1, wherein the interconnecting conductor is formed in bar fashion.

3. The manufacturing method according to claim 1, wherein the interconnecting conductor is formed in an island fashion.

4. The manufacturing method according to claim 1, further comprising forming a nickel-gold layer on the bonding region of the interconnecting conductor.

5. The manufacturing method according to claim 1, wherein the dielectric layer is extended to be disposed on lower surfaces of the leads.

6. The manufacturing method according to claim 1, further comprising disposing a metal plate under the dielectric layer.

7. The manufacturing method according to claim 1, wherein the insulation layer is a solder mask layer.

* * * * *